United States Patent [19]

Liaw et al.

[11] Patent Number: 5,915,192
[45] Date of Patent: Jun. 22, 1999

[54] METHOD FOR FORMING SHALLOW TRENCH ISOLATION

[75] Inventors: Jhon-Jhy Liaw, San Chung; Jin-Yuan Lee, Hsinchu, both of Taiwan

[73] Assignee: Taiwan Semiconductor Manufacturing Co., Ltd., Hsinchu, Taiwan

[21] Appl. No.: 08/928,280

[22] Filed: Sep. 12, 1997

[51] Int. Cl.$^6$ .................................................. H01L 21/76
[52] U.S. Cl. .......................... 438/435; 438/424; 438/410; 438/437; 148/DIG. 50
[58] Field of Search .................................. 438/424, 427, 438/425, 435, 437, 433, 410; 148/DIG. 50

[56] References Cited

U.S. PATENT DOCUMENTS

| | | | |
|---|---|---|---|
| 4,604,162 | 8/1986 | Sobczak | 438/410 |
| 4,615,746 | 10/1986 | Kawakita et al. | 438/410 |
| 4,685,198 | 8/1987 | Kawakita et al. | 148/DIG. 50 |

*Primary Examiner*—Trung Dang
*Attorney, Agent, or Firm*—Christensen O'Connor Johnson & Kindness PLLC

[57] ABSTRACT

A method of forming a trench isolation is disclosed. The initial step includes forming a first dielectric layer on a substrate of a transistor followed by a second dielectric layer formed on the first dielectric layer. Next, the substrate, the first dielectric layer and the second dielectric layer is patterned and etched to form a trench in the substrate, the first dielectric layer and the second dielectric layer. Next, a third dielectric layer is formed on the surface of the side wall of the trench followed by isotropically etching the bottom of the trench. Finally, a fourth dielectric layer on the surface of the trench is formed and the trench is filled with a dielectric material.

20 Claims, 6 Drawing Sheets

METHOD FOR FORMING SHALLOW TRENCH ISOLATION

TECHNICAL FIELD OF THE INVENTION

This invention is related to a method for trench isolation, and more particularly, to a method for shallow trench isolation.

BACKGROUND OF THE INVENTION

In CMOS ICs, like kinds of devices within a given well must be isolated in the same manner as the devices in either a NMOS or PMOS circuit. However, the isolation requirements of CMOS technology extend beyond those of either PMOS or NMOS alone, in that in CMOS it is also necessary to isolate the p- and n- channel devices from one another. The isolation of p-channel from n-channel devices must satisfy two requirements. The first is that any possible leakage currents that could flow between adjacent PMOS and NMOS must be suppressed. The second is that the susceptibility of CMOS to latchup must be minimized.

In CMOS structures, the isolation spacing between the n- and p-channel device is defined as the total of the distances between the edge of the $n^+$ region of the n-channel and the edge of the $p^-$ region of the p-channel (or, in other words, the $n^+$ to $p^+$ spacing).

In fabricating CMOS circuits, the isolation of PMOS and NMOS is usually performed by a trench. Deep-trench processes offer the benefit of producing a latchup immune CMOS circuit. However, deep-trench structures generally require significantly increased manufacturing process complexity, and consequently result in potentially lower productivity (i.e., lower throughput and yield). To get rid of the disadvantage of deep-trench processes, shallow-trench processes are used to perform the isolation process in CMOS processes.

Shallow-trench isolation is carried out by the configuration shown in FIG. 1A. In a CMOS circuit, the NMOS 150 is established in a p-well and the PMOS 151 is established in an n-well, respectively. The p-well of NMOS 150 is used to isolate the NMOS 150 from the PMOS 151. Also, the trench 100 is used to separate the $n^+$ region 101 of NMOS 150 and $p^+$ region 102 of PMOS 151. To proceed with the shallow-trench isolation, it is important to form the edge 103 of p-well in a proper position. Because the p-well is used to isolate the PMOS 150 and NMOS 151, the distance between the sidewall of the p-well 103 and the $p^+$ region 102 must be large enough to prevent the latchup of the CMOS.

To reduce the dimension of the CMOS circuit, the dimension of trench 100 must be shrunk. As the width of the trench 100 reduced, the fabrication of the p-well becomes more difficult. Because the width of the trench 100 is reduced, the alignment of the p-well mask is more difficult.

As an example of an improperly aligned p-well, FIG. 1B shows that the edge 104 of the p-well is shifted to the right and near the $p^+$ region 102 of PMOS 151. Under these conditions, latchup easily occurs.

SUMMARY OF THE INVENTION

A method of forming a trench isolation is disclosed. The method comprises the steps of: forming a first dielectric layer on a substrate of a transistor; forming a second dielectric layer on said first dielectric layer; patterning and etching said substrate, said first dielectric layer and said second dielectric layer to form a trench in said substrate, said first dielectric layer and said second dielectric layer; forming a third dielectric layer on the surface of the side wall of said trench; isotropically etching the bottom of said trench; forming a fourth dielectric layer on the surface of said trench being isotropically etched; and refilling said trench with a dielectric material.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

Figure 1A:
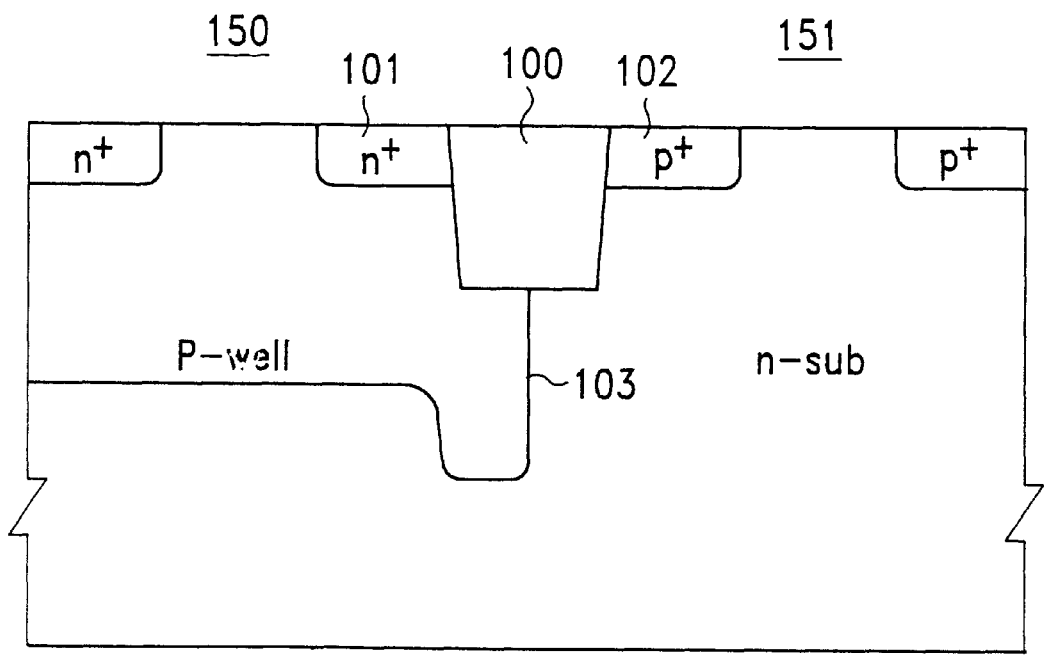
FIG. 1A shows a transverse sectional view of the structure formed by traditional shallow-trench isolation in a CMOS IC.
Figure 1B:
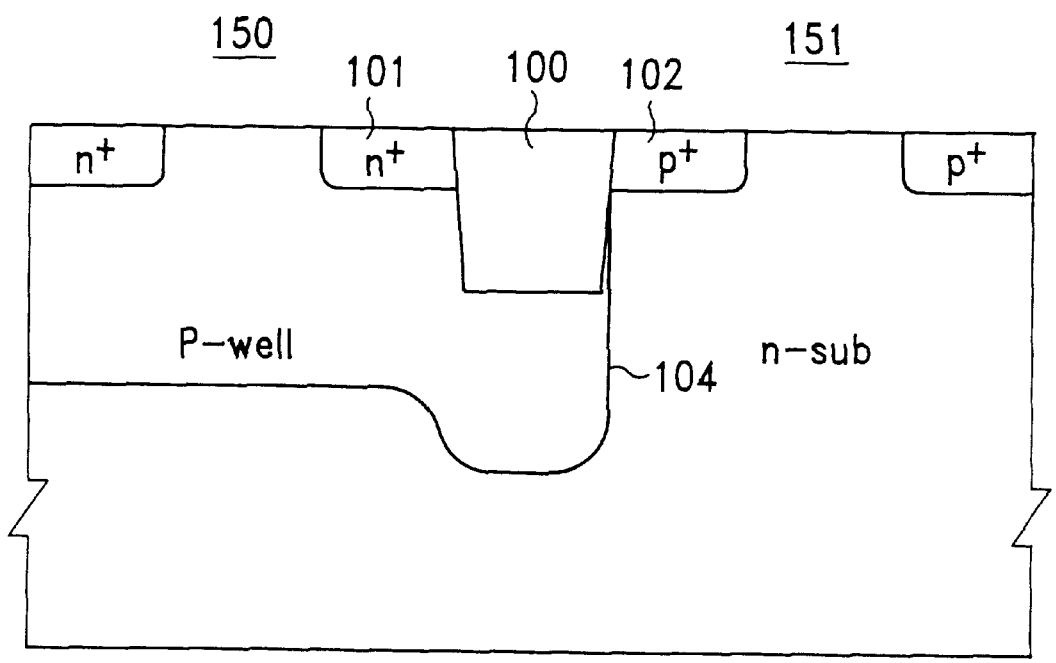
FIG. 1B shows a transverse sectional view of the structure formed by traditional shallow-trench isolation in a CMOS IC with the p-well mask misaligned.
Figure 2A:
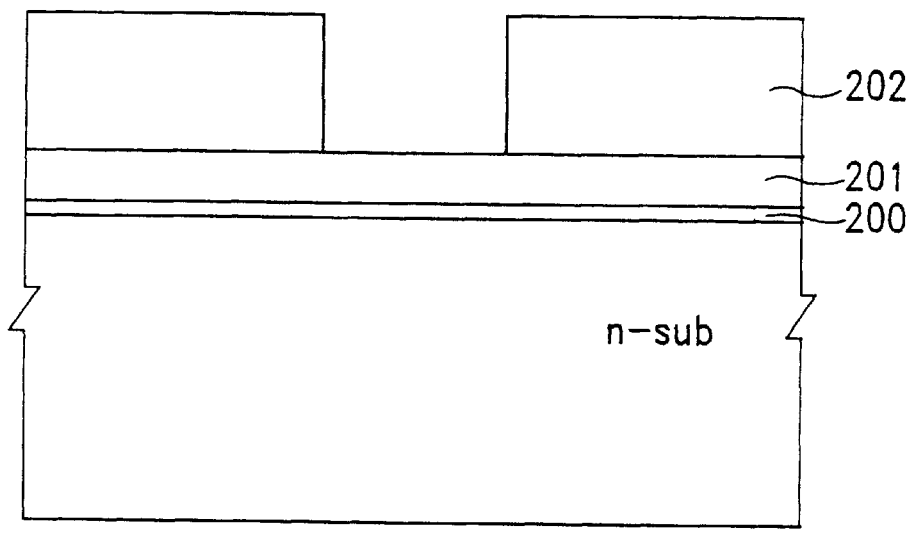
FIGS. 2A–2G shows the formation of a shallow trench isolation structure of the present invention.

The present invention offers a process that can provide a shallow-trench isolation with more tolerance of misalignment. The manufacturing process is described in conjunction with FIGS. 2A–2G. Referring to FIG. 2A, pad oxide layer 200 and silicon nitride layer 201 are sequentially deposited on the n-substrate (n-sub). The thickness of pad oxide layer 200 and silicon nitride ($Si_3N_4$) layer 201 are 30~200 angstroms and 1500~3000 angstroms, respectively. The pad oxide layer 200 is formed by thermal oxidation and the silicon nitride ($Si_3N_4$) layer 201 is formed by LPCVD (Low Pressure Chemical Vapor Deposition). On top of the silicon nitride 201 is a photoresist masking layer 202, having a window pattern. This pattern is defined using standard photoresist coating, exposure and developing processes. The solution used to remove the photoresist is a solution of $H_2SO_4$.

Figure 2B:
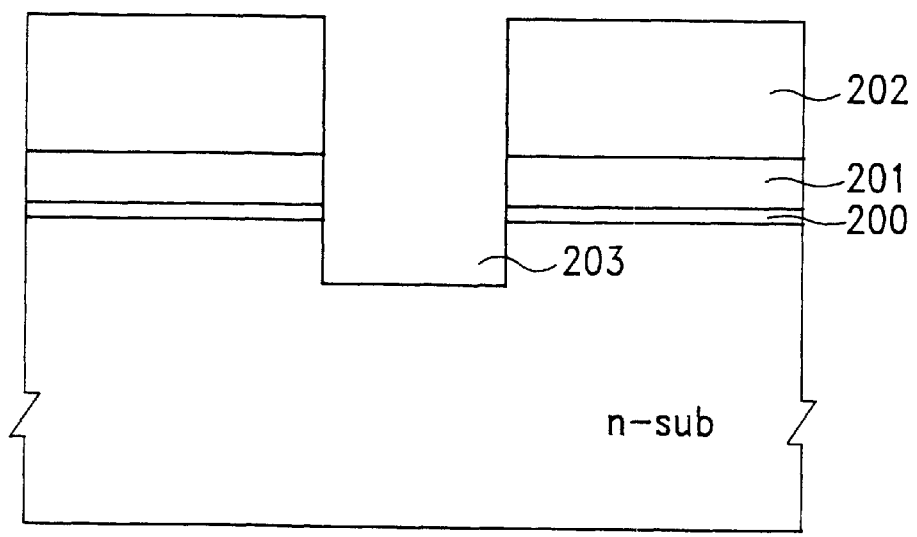

FIG. 2B shows the resulting structure after the n-sub, pad oxide layer 200 and silicon nitride layer 201 are etched to the depth of 2000~5000 angstroms into the n-sub. Thus, a trench 203 of depth 2000~5000 angstroms is formed in the n-sub. The method used to remove portions of pad oxide layer 200 and silicon nitride ($Si_3N_4$) layer 201 is preferably wet etching using $CCl_2F_2$ solution as an etchant. The trench 203 is formed by etching the n-sub using the gas mixture of $CClF_3$ and $Cl_2$ as an etchant.

Figure 2C:
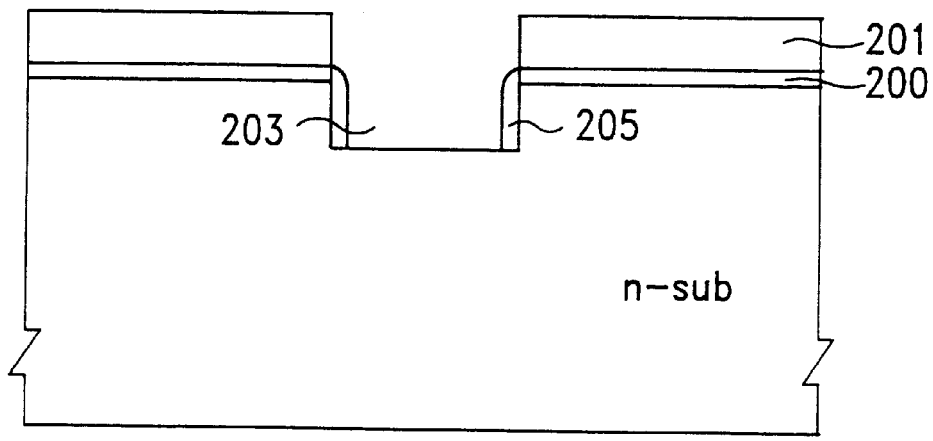

Next, turning to FIG. 2C, the photoresist layer 202 is removed and a silicon dioxide layer 205 is formed on the sidewall of trench 203. The silicon dioxide layer 205 may be formed by thermal oxidation on the surface of trench 203. The thickness of the silicon dioxide layer 205 described above is about 110~400 angstroms. FIG. 2C shows the resulting structure after the portion of silicon dioxide layer 205 described above at the bottom of trench 203 is removed. The anisotropic etchant used in this removal step is $CHF_3$. Thus, the residual silicon dioxide layer 205 is formed at the surface of the sidewall of the trench 203.

Figure 2D:
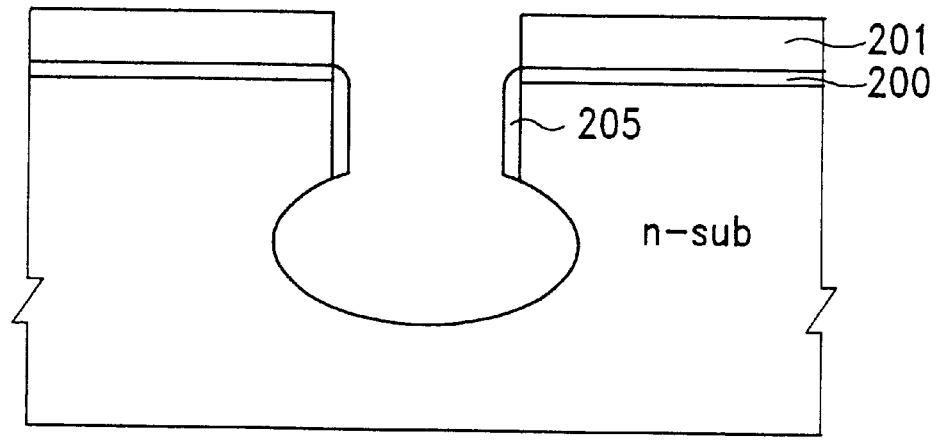
Figure 2:
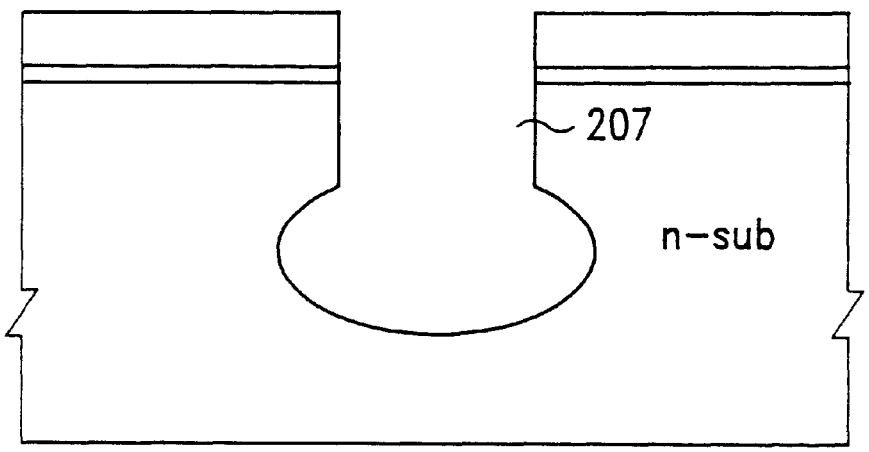

Using the residual silicon dioxide layer 205 as a mask, $SF_6$ is used as an etchant to isotropically etch the polysilicon at the bottom of the trench 203. FIG. 2D shows the resulting structure after the polysilicon at the bottom of the trench 203 is isotropically etched. The isotropic etching proceeds until approximately 1000~3000 angstroms of the n-sub is removed.

Referring to FIG. 2E, the residual silicon dioxide layer 205 is removed and the profile of the further etched trench 207 is thus formed. To remove the residual silicon dioxide layer 205 shown in FIG. 2D, a solution of $CF_4$ is used as an etchant in the wet etching.

Figure 2F:
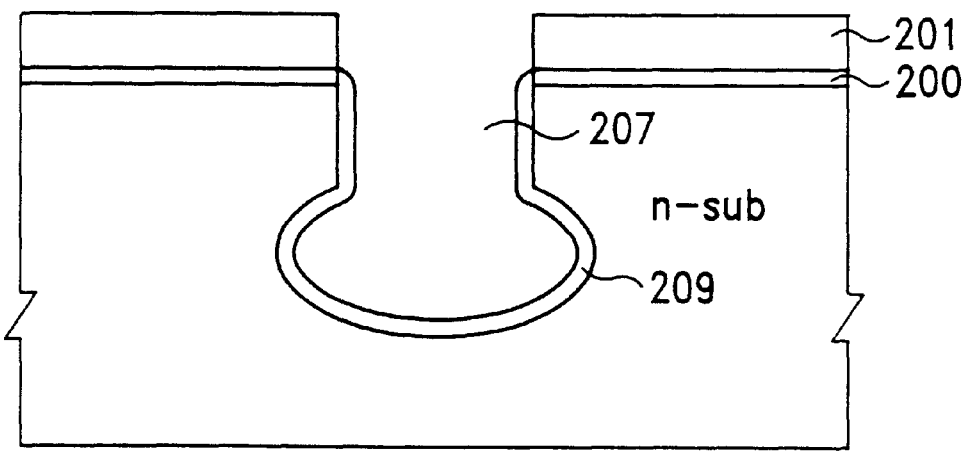

FIG. 2F shows the resulting structure after the inner silicon dioxide layer 209 is formed on the surface of further etched trench 207. The inner silicon dioxide layer 209 is preferably 110~400 angstroms thick and grown by thermal oxidation.

Figure 2G:
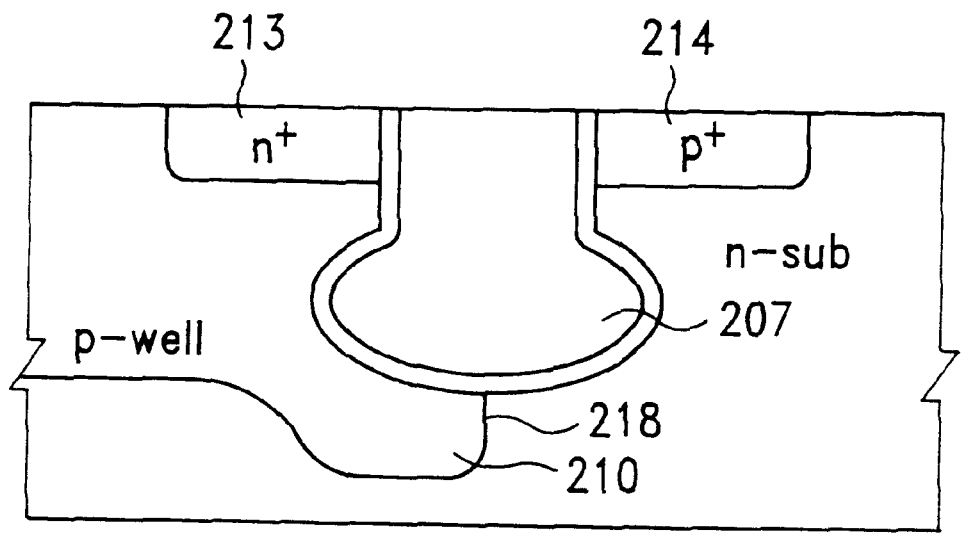

The following steps are the processes used to fabricate a CMOS and are standard in the prior art. FIG. 2G shows the resulting structure after all the processes are finished. In FIG. 2G the further etched trench 207 is filled with polysilicon and p-well 210 is properly aligned within the trench 207. In addition, the $n^+$ region 213 and the $p^+$ region 214 are formed by ion implantation. Clearly, the edge 218 of the p-well 210 are separated from $p^+$ region 214 by trench 207, so the latchup of the CMOS is effectively prevented by this structure.

Even if the p-well mask is not aligned properly, the edge of p-well 210 also can be separated from p+ region 214 by the convex shape of trench 207. Though the distance of $p^+$ region 214 and $n^+$ region 213 are the same as the prior art, the convex shape of trench 207 enhances the tolerance of misalignment of the p-well mask.

Although specific embodiments have been illustrated and described, it will be obvious to those skilled in the art that various modification may be made without departing from the spirit which is intended to be limited solely by the appended claims.

What is claimed is:

1. A method of forming a trench isolation comprising the steps of:

forming a first dielectric layer on a substrate of a transistor;

forming a second dielectric layer on said first dielectric layer;

patterning and etching said substrate, said first dielectric layer and said second dielectric layer to form a trench in said substrate, said first dielectric layer and said second dielectric layer;

forming a third dielectric layer on the surface of the side wall of said trench;

isotropically etching the bottom of said trench to expand a portion of said trench;

forming a fourth dielectric layer on the surface of said trench and said expanded portion; and refilling said trench with a dielectric material.

2. The method as claim 1, wherein said first dielectric layer is a silicon dioxide layer of 30~200 angstroms in thickness.

3. The method as claim 1, wherein said second dielectric layer is a silicon nitride ($Si_3N_4$) layer of 1500~3000 angstroms in thickness.

4. The method as claim 1, wherein said trench is 1500~3000 angstroms in depth in the substrate.

5. The method as claim 1, wherein said third dielectric layer is formed comprising the following steps:

forming a silicon dioxide layer on the surface of said trench; and removing the portion of said silicon layer on the bottom of said trench.

6. The method as claim 5, wherein said silicon dioxide layer is 110~350 angstroms in thickness.

7. The method as claim 1, wherein the bottom of said trench is isotropically etched by the etchant of $SF_6$.

8. The method as claim 7, wherein the bottom of said trench is isotropically etched for 1000~3000 angstroms in depth.

9. The method as claim 1, wherein said method for trench isolation further comprises the step of removing said third dielectric layer before said fourth dielectric layer is formed.

10. The method as claim 1, wherein said fourth dielectric layer is formed by thermal oxidation.

11. The method as claim 1, wherein said fourth dielectric layer is 1000~3000 angstroms in thickness.

12. The method as claim 1, wherein said dielectric material is polysilicon.

13. A method of forming a trench isolation comprising the steps of:

forming a first dielectric layer on a substrate of a transistor;

forming a second dielectric layer on said first dielectric layer;

patterning and etching said substrate, said first dielectric layer and said second dielectric layer to form a trench in said substrate, said first dielectric layer and said second dielectric layer, said trench extending into said substrate by 1500~3000 angstroms in depth;

forming a third dielectric layer on the surface of the side wall of said trench;

isotropically etching the bottom of said trench for 1000~3000 angstroms in depth;

removing said third dielectric layer;

forming a fourth dielectric layer on the surface of said trench being isotropically etched, said fourth dielectric layer is formed by thermal oxidation; and refilling said trench with a dielectric material.

14. The method as claim 13, wherein said first dielectric layer is a silicon dioxide layer of 30~200 angstroms in thickness.

15. The method as claim 13, wherein said second dielectric layer is a silicon nitride ($Si_3N_4$) layer of 1500~3000 angstroms in thickness.

16. The method as claim 13, wherein said third dielectric layer is formed comprising the following steps:

forming a silicon dioxide layer on the surface of said trench; and removing the portion of said silicon layer on the bottom of said trench.

17. The method as claim 13, wherein said silicon dioxide layer is 110~350 angstroms in thickness.

18. The method as claim 13, wherein the bottom of said trench is isotropically etched by the etchant $SF_6$.

19. The method as claim 13, wherein said fourth dielectric layer is 1000~3000 angstroms in thickness.

20. The method as claim 13, wherein said dielectric material is polysilicon.

* * * * *